(12) United States Patent
Xing et al.

(10) Patent No.: US 12,191,367 B2
(45) Date of Patent: Jan. 7, 2025

(54) MULTI-FINGER TRANSISTOR STRUCTURE AND METHOD OF MANUFACTURING THE SAME

(71) Applicant: UNITED MICROELECTRONICS CORP., Hsin-Chu (TW)

(72) Inventors: Su Xing, Singapore (SG); Purakh Raj Verma, Singapore (SG); Rudy Octavius Sihombing, North Sumatera (ID); Shyam Parthasarathy, Singapore (SG); Jinyu Liao, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 391 days.

(21) Appl. No.: 17/752,888

(22) Filed: May 25, 2022

(65) Prior Publication Data
US 2023/0163184 A1   May 25, 2023

(30) Foreign Application Priority Data
Nov. 19, 2021  (CN) .......................... 202111397934.X

(51) Int. Cl.
| H01L 29/423 | (2006.01) |
| H01L 21/8234 | (2006.01) |
| H01L 29/06 | (2006.01) |
| H01L 29/417 | (2006.01) |

(52) U.S. Cl.
CPC .. *H01L 29/4238* (2013.01); *H01L 21/823418* (2013.01); *H01L 21/823481* (2013.01); *H01L 29/0653* (2013.01); *H01L 29/41758* (2013.01)

(58) Field of Classification Search
None
See application file for complete search history.

(56) References Cited

U.S. PATENT DOCUMENTS 10,847,466 B2   11/2020   Saka

*Primary Examiner* — Anthony Ho
(74) *Attorney, Agent, or Firm* — Winston Hsu

(57) ABSTRACT

A multi-finger transistor structure is provided in the present invention, including multiple active areas, a gate structure consisting of multiple gate parts and connecting parts, wherein each gate part crosses over one of the active areas and each connecting part alternatively connects one end and the other end of the gate parts so as to form a meander gate structure, and multiple sources and drains, wherein one source and one drain are set between two adjacent gate parts, and each gate parts is accompanied by one source and one drain at two sides respectively, and the distance between the drain and the gate part is larger than the distance between the source and the gate part, so that the source and the drain are asymmetric with respect to the corresponding gate part, and air gaps are formed in the dielectric layer between each drain and the corresponding gate part.

9 Claims, 8 Drawing Sheets

MULTI-FINGER TRANSISTOR STRUCTURE AND METHOD OF MANUFACTURING THE SAME

BACKGROUND OF THE INVENTION

1. Field of the Invention

The present invention relates generally to a multi-finger transistor structure and method of manufacturing the same, and more specifically, to a multi-finger transistor structure with asymmetric source/drain and method of manufacturing the same.

2. Description of the Prior Art

The emergence of smartphone and 5G telecommunication network technology promotes tremendous demand for the silicon-on-insulator (SOI) substrate in the industry, especially for RF (radio frequency)-SOI substrate. RF-SOI is dedicated to be used in the manufacture of specific RFIC (ex. switch and antenna tuner) in smartphone or other products, which is equivalent to a RF version of SOI technology, to improve harmonic distortion and recover high resistance property of the substrate, so as to reduce insertion loss of the RF devices and improve system linearity.

Particularly, in response to the gradually improved application of 5G communication network in the future, the demand for RF front-end modules like power amplifier (PA) and low noise amplifier (LNA) developed specifically to the millimeter wave (mmWave) using 20-60 GHz frequency bands is highly increased, necessary size miniaturization and high-frequency operation test the limits of these two types of antennas-connecting devices. Although the miniaturization may facilitate the improvement of cut-off frequency ($f_T$) for the MOS devices, the gate resistance ($R_G$) is increased and the maximum oscillation frequency ($f_{max}$) and the breakdown voltage ($BVD_{SS}$) are reduced at the same time. In order to keep the breakdown voltage ($BVD_{SS}$) in a necessary level and maintain the high-frequency property for the device, the parasitic capacitance ($C_{GD}$) between gate and drain should be reduced as much as possible, in order to respond and accomplish the well deployment of 5G communication technology in the future. This is a topic for those of skilled in the art dedicating to develop and improve.

SUMMARY OF THE INVENTION

In the light of aforementioned demand in 5G communication market, the present invention hereby provides a novel multi-finger transistor structure and method of manufacturing the same, with features of asymmetric source/drain design and air gap structures to reduce the parasitic capacitance ($C_{GD}$) of devices. In addition, finger parts of the transistor are isolated by shallow trench isolations, so that one photomask is saved in the formation of lightly-doped drains (LDD) of the devices.

One aspect of the present invention is to provide a multi-finger transistor structure, including multiple active areas, a gate structure with multiple gate parts and multiple connecting parts, wherein each said gate part traverses one of said active areas, and each connecting part alternatively connect one end and the other end of two adjacent said gate parts so as to form meander said gate structure, and multiple sources and drains, wherein one of said sources and one of said drains are set between two adjacent said gate parts, and one of said sources and one of said drains are set at two sides of each said gate part, and a distance between said drain and corresponding said gate part is larger than a distance between said source and corresponding said gate part, and air gaps in a dielectric layer between each said drain and corresponding said gate part.

Another aspect of the present invention is to provide a method of manufacturing a multi-finger transistor structure, including steps of providing a substrate, forming shallow trench isolations in said substrate to define multiple active areas, forming a gate structure on said substrate, wherein said gate structure comprises multiple gate parts and multiple connecting parts, and each said gate part traverses over one of said active area, and each said connecting part alternatively connect one end and the other end of two adjacent said gate parts, so as to form meander said gate structure, forming one source doped region and one drain doped region in said substrate at two sides of each said gate part, wherein a distance between said drain doped region and said gate part is larger than a distance between said source doped region and said gate part, forming a dielectric layer on said gate structure and said substrate, and forming air gaps in said dielectric layer between each said drain doped region and corresponding said gate part.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
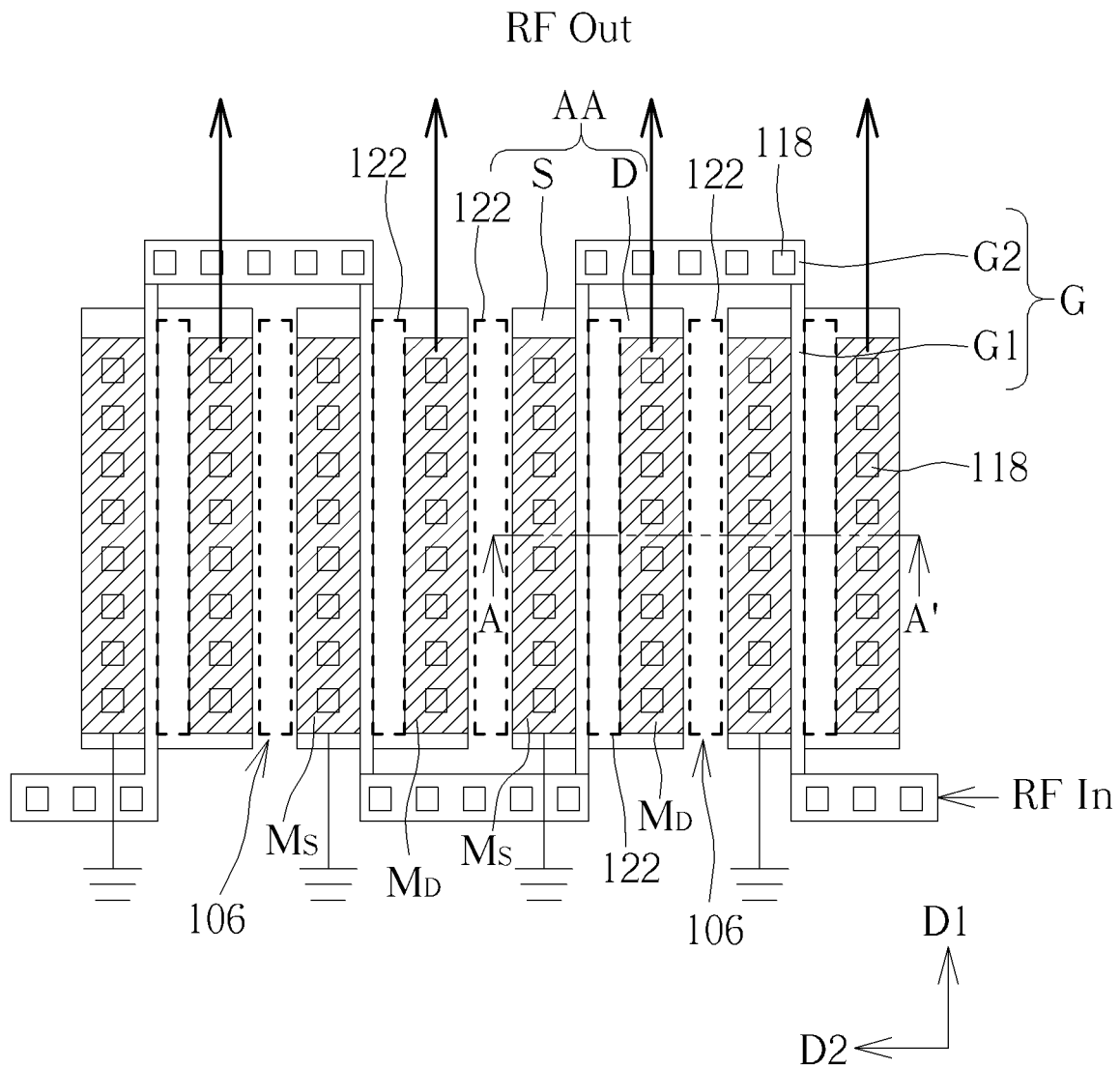
FIG. 1 is a top view of a multi-finger transistor structure in accordance with one preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
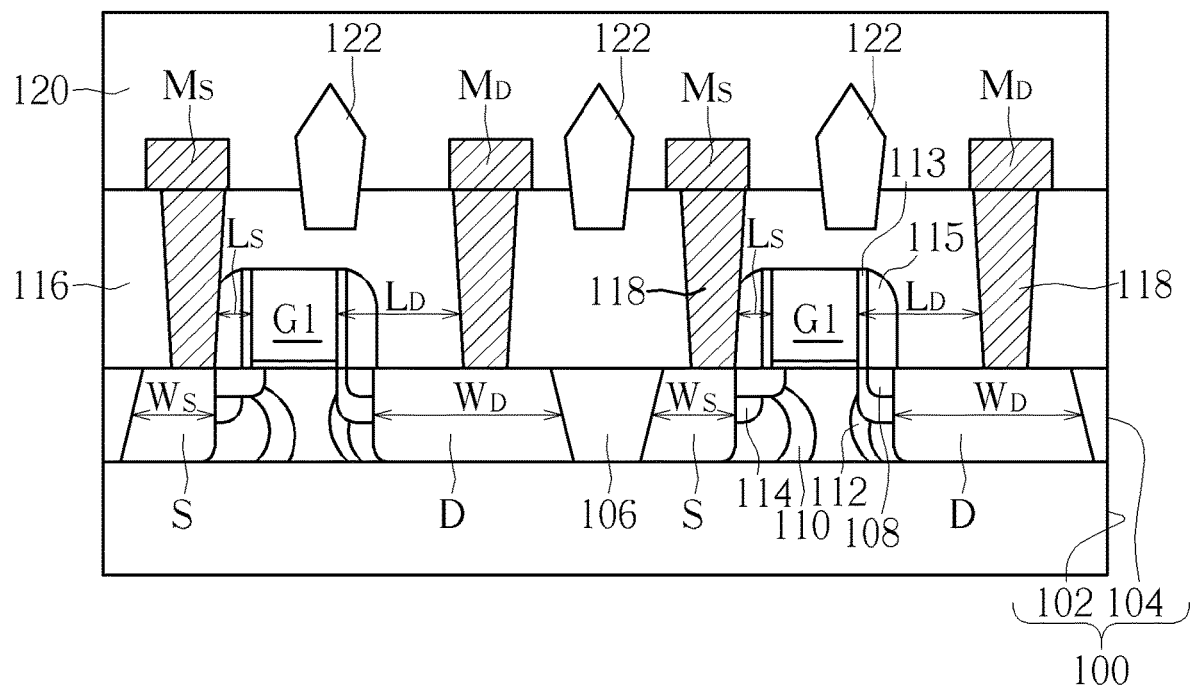
FIG. 2 is a cross-section of a multi-finger transistor structure in accordance with the preferred embodiment of the present invention.

The purpose of present invention is to provide a multi-finger transistor structure, which intended to be applied in the manufacture of devices like power amplifier (PA) and low noise amplifier (LNA) in radio frequency (RF) front-end module of 5G communication network technology. FIG. 1 and FIG. 2 will be referred in following paragraphs to describe the planar structure and cross-sectional structure of the multi-finger transistor in present invention, and FIGS. 3-9 will be referred to describe entire process flow of manufacturing the multi-finger transistor. Please note that these cross-sections only show two device structures as an example. In actual practice, there may be multiple devices regularly arranged in one layout area.

First, please refer collectively to FIG. 1 and FIG. 2, which are respectively a top view and a cross-section of a multi-finger transistor structure in accordance with one preferred embodiment of present invention. The multi-finger transistor of present invention is constituted on a semiconductor substrate 100, especially a silicon-on-insulator (SOI) substrate, which is highly suitable for manufacturing required devices like switch, low noise amplifier or signal generator in mmWave frequency bands of 5G communication network system. In the embodiment of present invention, the semiconductor substrate 100 includes a silicon oxide layer 102 with a thickness about 200-400 nm and a silicon layer 104 with a thickness about 50-200 nm on the silicon oxide layer 102. The silicon oxide layer 102 functions as a buried oxide isolating layer for the SOI semiconductor substrate 100 to reduce the capacitance between field-effect transistor (FET) devices and the substrate, improve operating speed and prevent leakage in order to reduce power consumption. The silicon layer 104 is preferably high-resistance mono-crystalline silicon layer to function as an active layer for the device and for various doped regions to be formed therein. A thicker silicon substrate (not shown) is set under the silicon oxide layer 102. In some embodiments, a polycrystalline-silicon-based trap layer may be further set between the silicon oxide layer 102 and the silicon substrate to trap electrons dissipated in the device in high frequency operation and improve the performance of RF devices. In other embodiments, the semiconductor substrate 100 may be GaN-on-Si or GaN-on-SiC substrate.

Refer still to FIG. 1 and FIG. 2. Doped regions like lightly-doped drains (LDD) 108, source pocket doped regions 110, drain pocket doped regions 112, doped drains (DD) 114, sources S and drains D are formed in the silicon layer 104 of semiconductor substrate 100, and a gate structure G is formed on the silicon layer 104. In planar view of substrate, individual silicon layers 104 are isolated by shallow trench isolations 106 to define multiple active areas AA. In the embodiment of present invention, each active area AA includes the aforementioned doped regions like LDD 108, source pocket doped region 110, drain pocket doped region 112, doped drain 114, source S and drain D. In the embodiment of present invention, active areas AA are preferably in rectangular shape and spaced apart from each other, with their major axis extending in a first direction D1. In other aspect, a gate structure G is formed on the semiconductor substrate 100 with material like polycrystalline silicon. In the embodiment of present invention, the gate structure G is constituted by multiple gate pars G1 and multiple connecting parts G2. More specifically, each gate parts G1 of the gate structure G is spaced apart and traverses in the first direction D1 over one corresponding active area AA. Each connecting part G2 of the gate structure G is set on the shallow trench isolation 106, which extends in a second direction D2 perpendicular to the first direction D1 and alternatively connect one end and the other end of two adjacent gate parts G1, so as to form meander gate structure G as shown in FIG. 1. Please note that FIG. 2 is a cross-section taken along the section line A-A' in FIG. 1. Only the gate parts G1 of the gate structure G crossed by the section line A-A' are shown in FIG. 2.

Refer still to FIG. 1 and FIG. 2. The gate part G1, source S and drain D on each active area AA constitute a FET device. First spacers 113 and second spacers 115 may be further formed at two sides of the gate parts G1 with material respectively like silicon nitride and silicon oxide, to protect the gate part G1 and define distances between the gate part G1 and source/drain S/D. An interlayer dielectric (ILD) layer 116 covers the gate parts G1 and active areas like source/drain S/D to provide a flat process surface. The material of interlayer dielectric layer 116 may be phosphosilicate glass (PSG), borophosphosilicate glass (BPSG) or low-k materials. Source metals $M_S$ and drain metals $M_D$ may be formed on the surface of interlayer dielectric layer 116 respectively above the positions of corresponding source/drain S/D thereunder. Source metals $M_S$ and drain metals $M_D$ may be formed in the level of first metal layer (M1) in CMOS back-end-of-line (BEOL) process, with low-resistance metal material like aluminum (Al), tungsten (W) and/or copper (Cu), and an inter-metal dielectric (IMD) layer 120 is covered thereabove with material like undoped silicon glass (USG), fluorosilicate glass (FSG) or low-k materials. In the embodiment of present invention, source metals $M_S$ and drain metals $M_D$ may be in a rectangular shape and spaced apart from each other, with their major axis extending in the first direction D1. Each source metal $M_S$ and drain metal $M_D$ connects one corresponding source/drain S/D thereunder through contacts 118 extending through the interlayer dielectric layer 116. In addition, multiple contacts 118 may be set on the connecting parts G2 of the gate structure G to connect outside. The material of contact 118 may be titanium (Ti), titanium nitride (TiN) or tungsten (W).

In the embodiment of present invention, every source metal $M_S$ may extend outwardly to a common ground, every drain metal $M_D$ may extend outwardly to a common RF output (RF Out), and the gate structure is connected to a RF input (RF In), so as to constitute a multi-finger structure. With respect to the operation of amplifier, signal is inputted from the RF input (RF In) through gate structure G and reaches impedance matching and gains with the drain metals $M_D$ functioned as a RF output (RF Out) during the transmission along the meander gate structure G. The multi-finger layout design may effectively reduce gate resistance ($R_g$) and the noise generated in the process.

Figure 11:
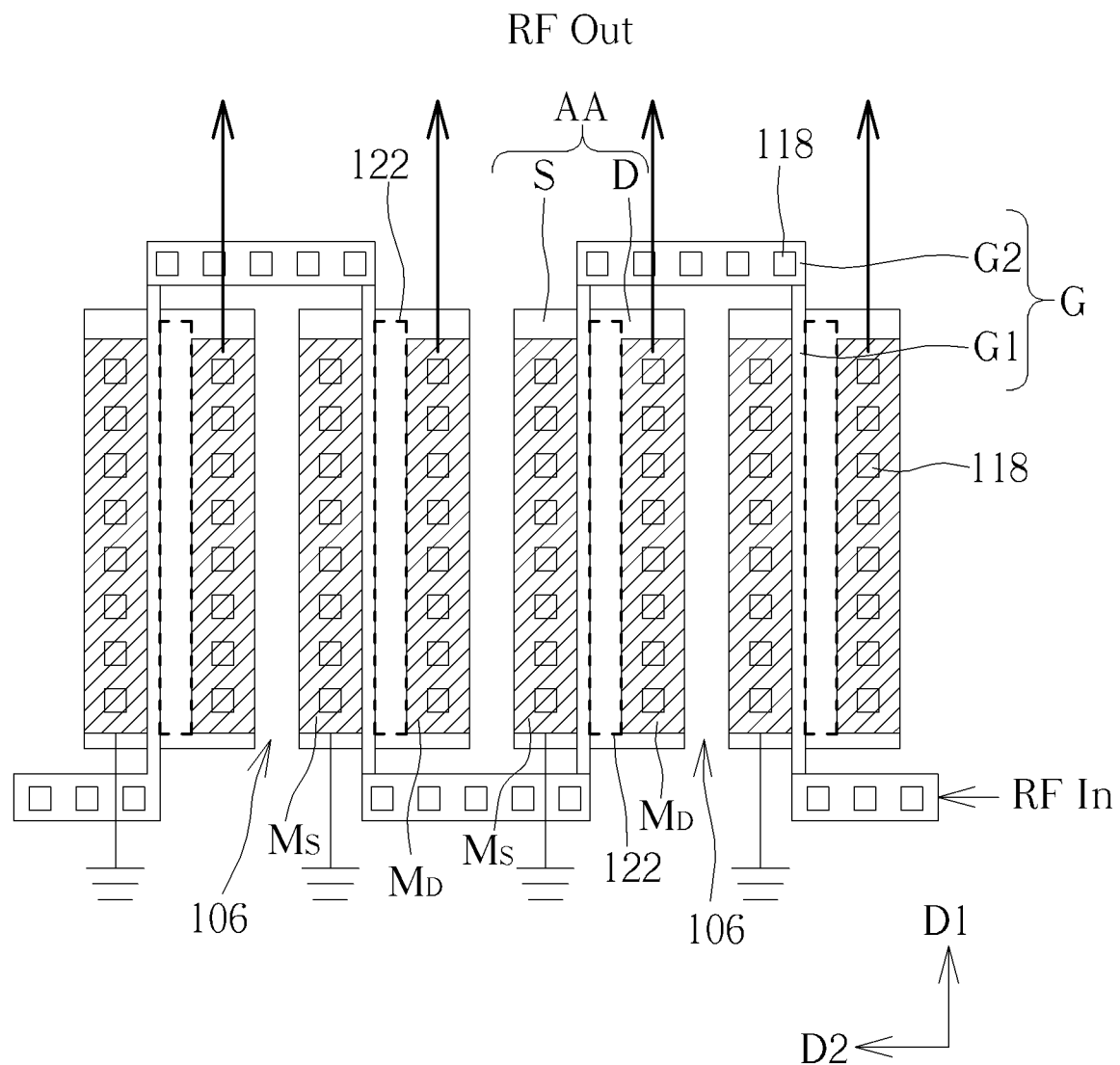
FIG. 11 is a top view of a multi-finger transistor structure in accordance with another embodiment of the present invention.
Figure 12:
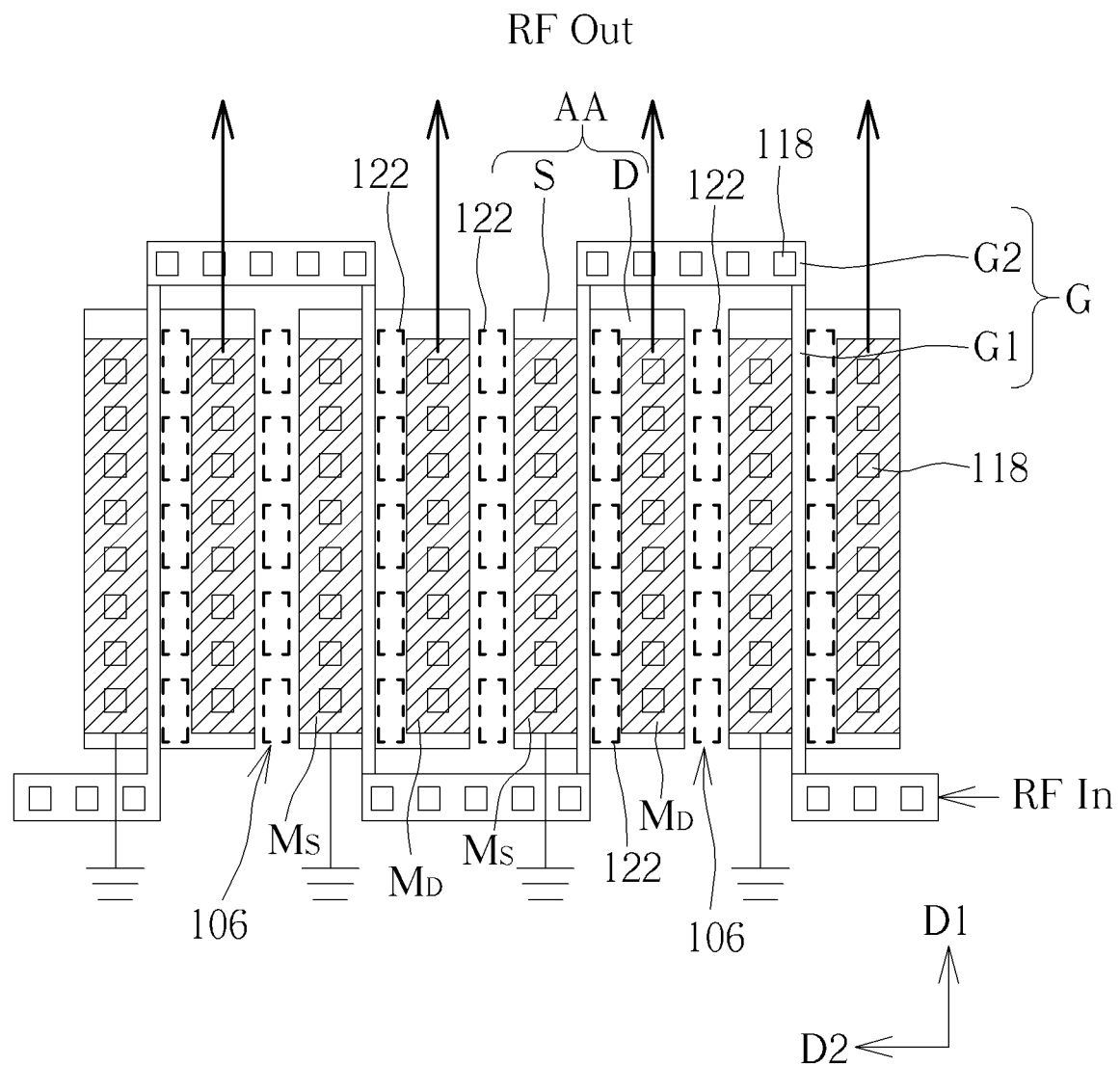
FIG. 12 is a top view of a multi-finger transistor structure in accordance with still another embodiment of the present invention.

Please note that in the preferred embodiment of present invention, every FET device has asymmetric source/drain S/D structure. As shown in FIG. 2, on the premise of the same area of active areas AA, the width $W_D$ of drain D in the second direction D2 is larger than the width $W_S$ of source S in the second direction D2 in every FET device, and the distance $L_D$ between the gate parts G1 and the contacts 118 on the drain D in the second direction D2 is larger than the distance $L_S$ between the gate parts G1 and the contacts 118 on the source S in the second direction D2. This layout design may effectively increase the breakdown voltage at drain side ($BVD_{SS}$) and reduce parasitic capacitance ($C_{GD}$) between drain D and gate part G1 to meet the requirement of RF devices in 5G communication network. Furthermore, in the preferred embodiment of present invention, air gaps 122 may be formed in the dielectric layer (including inter-layer dielectric layer 116 and inter-metal dielectric layer 120) between the source metal $M_S$ and drain metal $M_D$. As shown in FIG. 1, these air gaps may extend in the first direction D1 and are distributed uniformly between source S and drain D and in the dielectric layer between the gate part G1 and drain D, in order to further reduce parasitic capacitance (ex. $C_{GD}$ or $C_{DS}$) between these components. In other embodiment, as shown in FIG. 11, air gaps 122 may be distributed only in the dielectric layer between the gate part G1 and drain D. Alternatively, in other embodiment, multiple air gaps may be formed in the dielectric layer between each drain D and corresponding gate part G1 and are spaced apart in the first direction D1, as shown in FIG. 12.

Please refer now to FIGS. 3-9, which illustrate cross-sections of a process flow of manufacturing the multi-finger transistor structure of the present invention.

Figure 3:
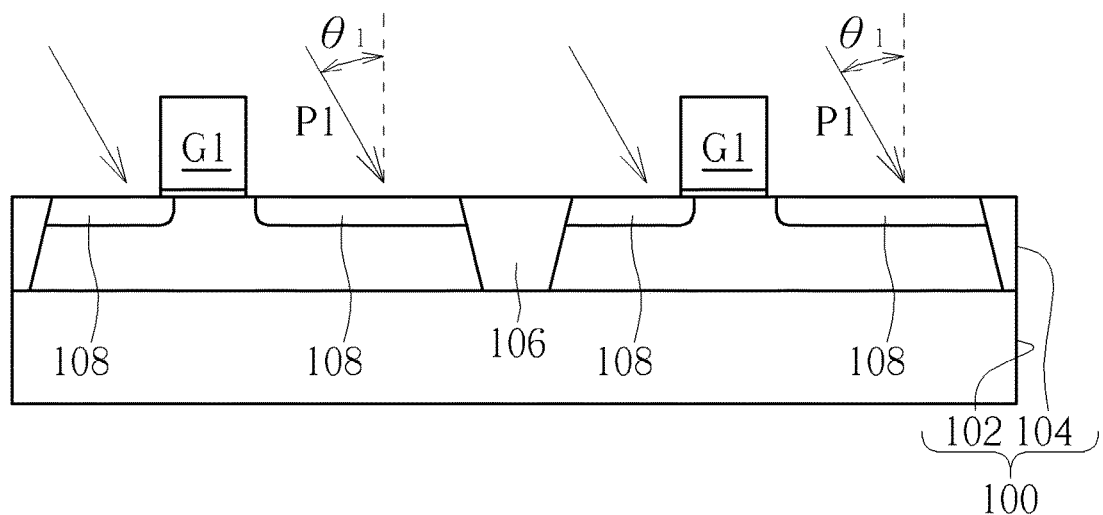
FIGS. 3-9 are cross-sections of a process flow of manufacturing the multi-finger transistor structure in accordance with the preferred embodiment of the present invention.

Please refer to FIG. 3. A semiconductor substrate 100 is provided as a base for manufacturing entire multi-finger transistor structure. The semiconductor substrate 100 may be a silicon-on-insulator (SOI) substrate, which includes a silicon oxide layer 102 and a silicon layer 104 on the silicon oxide layer 102. Shallow trench isolations (STIs) 106 may be formed in advance in the silicon layer 104 to define individual active areas for devices. A corresponding gate part G1 is formed on each active area. The gate part G1 may include a polycrystalline silicon layer and a gate dielectric layer between the polycrystalline silicon layer and the silicon layer 104, which may be formed by patterning a deposited material through a photolithography process. After the gate part G1 is formed, an ion implantation process P1 is performed to form lightly-doped drains (LDDs) 108 respectively in the active area at two sides of the gate part G1, in order to avoid short channel effect for the device. The ion implantation process P1 may be an inclined doping process, which the included angle $\theta_1$ between the doping angle and the normal line perpendicular to the substrate surface may be 0-45°. Take NMOS device as an example, the ion implantation process P1 may dope n-type dopants into the active area, such as the ions of phosphorus (P), arsenic (As) or antimony (Sb) element, to form n-type LDD 108. Since the doping angle is inclined, the LDDs 108 formed at source side and drain side are asymmetric with respect to the gate part G1. The LDD 108 at source side is closer to the center line of gate part G1 than the LDD 108 at drain side. Please note that in this ion implantation process P1, since STIs 106 are already formed to isolate between the devices, only one inclined doping process is required to form the LDDs 108 simultaneously at source side and drain side. Separate forming of LDDs is unnecessary, and the cost of one photomask may be saved in the process.

Figure 4:
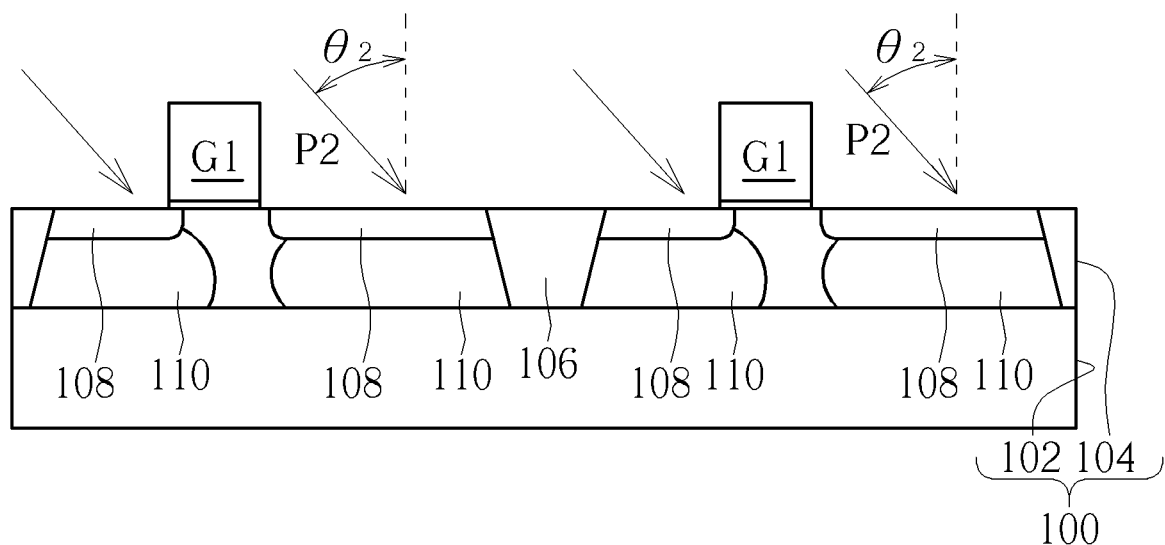

Please refer to FIG. 4. After the LDDs 108 are formed, another ion implantation process P2 is then performed to form source pocket doped regions (also known as halo doped regions) 110 in the active area respectively under the LDDs 108 at two sides of gate part G1. The ion implantation process P2 may be an inclined doping process, which the included angle $\theta_2$ between the doping angle and the normal line perpendicular to the substrate surface may be 10-45°. Take NMOS device as an example, the ion implantation process P2 may dope p-type dopants into the active area, such as the ions of boron (B), boron difluoride ($BF_2$) or Indium (In) element, to form p-type source pocket doped regions 110. Since the doping angle is inclined, the pocket doped regions formed at source side and drain side are asymmetric with respect to the gate part G1. The source pocket doped region 110 at source side is closer to the center line of gate part G1 than the source pocket doped region 110 at drain side. Please note that the doping angle of ion implantation process P2 is preferably larger than the doping angle of ion implantation process P1, so that the source pocket doped region 110 at source side would extend laterally beyond the LDD 108 toward the gate part G1.

Figure 5:
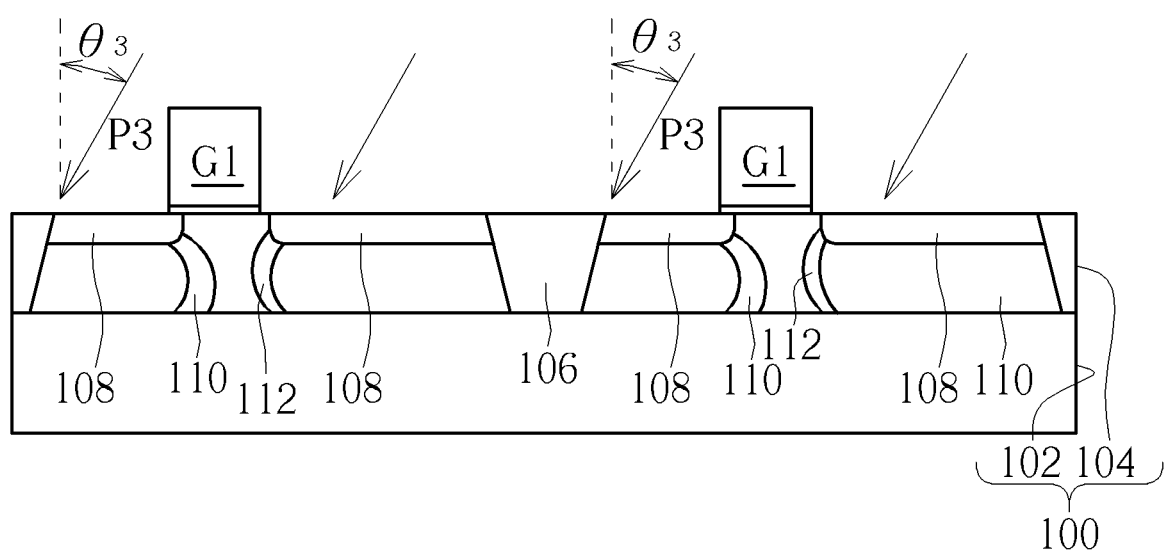

Please refer to FIG. 5. After the source pocket doped region 110 is formed, another ion implantation process P3 is then performed to form drain pocket doped regions 112 in the active area respectively under the LDDs 108 at two sides of gate part G1. Similarly, the ion implantation process P3 may be an inclined doping process, which the included angle $\theta_3$ between the doping angle and the normal line perpendicular to the substrate surface may be −5~−45°. Take NMOS device as an example, the ion implantation process P3 may dope p-type dopants into the active area, such as the ions of boron (B), boron difluoride ($BF_2$) or Indium (In), to form p-type drain pocket doped regions 112. Since the doping angle is inclined, the pocket doped regions formed at source side and drain side are asymmetric with respect to the gate part G1. The drain pocket doped region 112 at drain side is closer to the center line of gate part G1 than the drain pocket doped region 112 at source side. It can be seen in the figure that the depth of drain pocket doped region 112 is the same as the depth of source pocket doped region 110, and the source pocket doped region 110 at source side extends laterally beyond the drain pocket doped region 112, and the drain pocket doped region 112 at drain side extends laterally beyond the source pocket doped region 110, to constitute the doping patterns required by the device. Please note that the doping angle of ion implantation process P3 is preferably smaller than the doping angle of ion implantation process P2, so that the laterally extending extent of drain pocket doped region 112 at drain side is smaller than the laterally extending extent of source pocket doped region 110 at source side. The source pocket doped region 110 and the drain pocket doped region 112 may further solve the short channel effect of the device and prevent electric breakdown.

Figure 6:
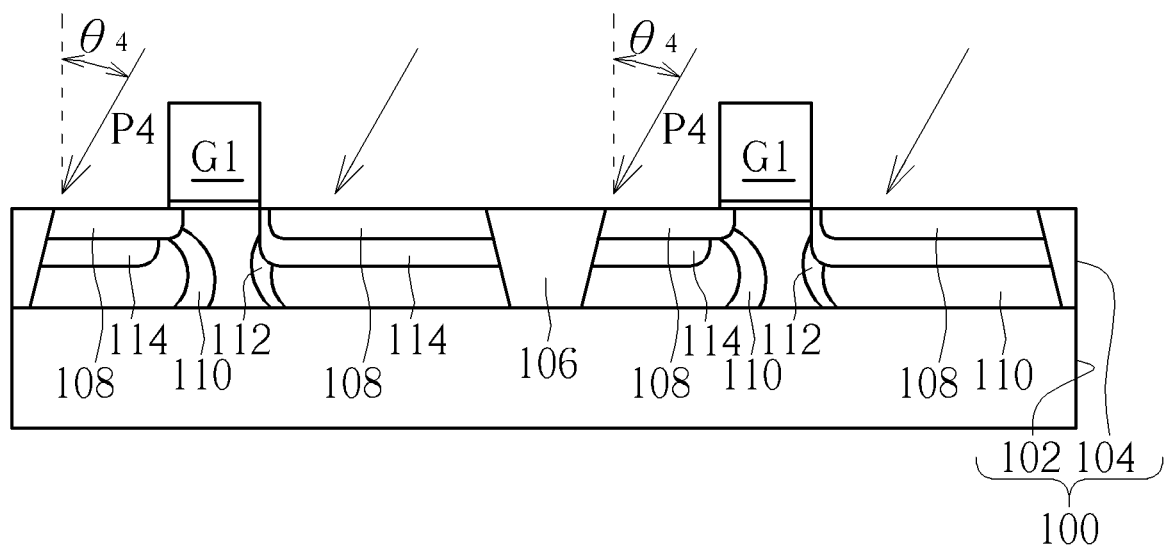

Please refer to FIG. 6. After the drain pocket doped regions 112 are formed, another ion implantation process P4 is then performed to form doped drains (DD) 114 in the active area respectively under the LDDs 108 at two sides of gate part G1. Similarly, the ion implantation process P4 may be an inclined doping process, which the included angle $\theta_4$ between the doping angle and the normal line perpendicular to the substrate surface may be 0~−20°. Take NMOS device as an example, the ion implantation process P4 may dope n-type dopants into the active area, such as the ions of phosphorus (P), arsenic (As) or antimony (Sb) element, to form n-type doped drains 114. Since the doping angle is inclined, the doped drains formed at source side and drain side are asymmetric with respect to the gate part G1. The doped drain 114 at drain side is closer to the center line of gate part G1 than the doped drain 114 at source side. It can be seen in the figure that the depth of doped drains 114 is deeper than the depth of LDDs 108, and the doping concentration of doped drains 114 is designedly lighter than the doping concentration of LDDs 108. The presence of doped drains 114 may modify the aforementioned doping patterns formed in previous process, in order to improve the breakdown voltage at drain side ($BVD_{SS}$).

Figure 7:
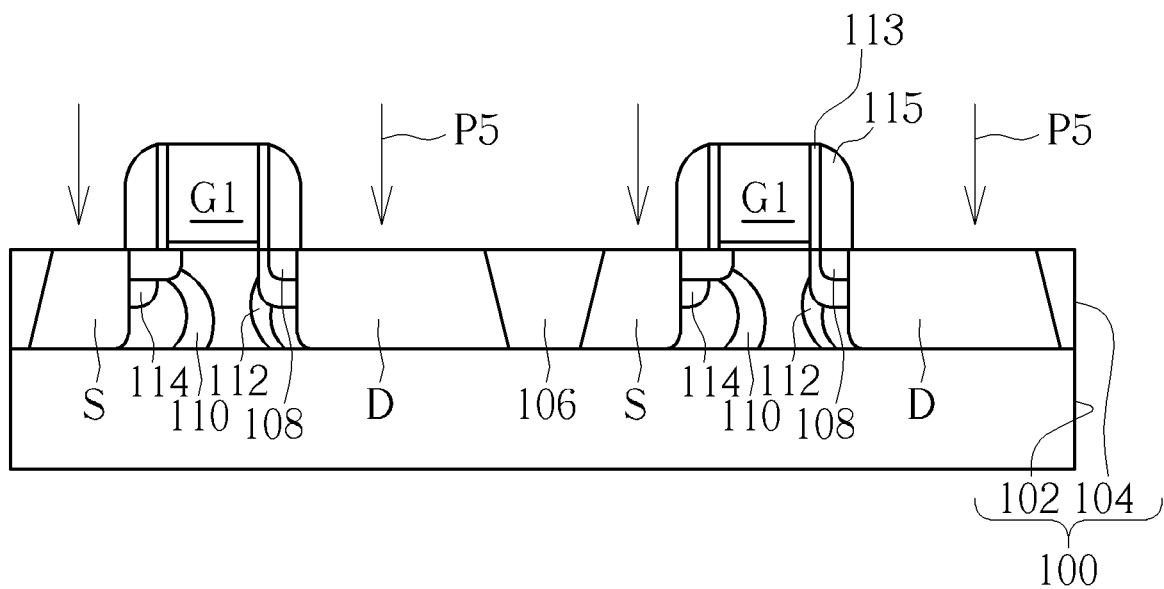

Please refer to FIG. 7. After the doped drains 114 are formed, first spacers 113 and second spacers 115 are formed at two sides of the gate part G1. The material of first spacer 113 and second spacer 115 may be silicon nitride and silicon oxide, respectively, to protect the gate part G1 and define the distance between gate part G1 and source/drain S/D. The first spacer 113 and the second spacer 115 may be formed through the steps like conformal deposition and anisotropic etching. After first spacers 113 and second spacers 115 are formed, another ion implantation process P5 is then performed to form source S and drain D in the active area respectively at two sides of the gate part G1. Take NMOS device as an example, similarly, the ion implantation process P5 may also use n-type dopants, such as the ions of phosphorus (P), arsenic (As) or antimony (Sb) element, to form source S and drain D. Different from the previous implantation processes, the ion implantation process P5 is a right-angle doping process, and the source S and drain D formed in the process are self-aligned with the first spacers 113 and the second spacers 115 and are formed at outer sides of the LDDs 108, with a doping concentration far higher than the ones of doped drains 114 and LDDs 108 with same conductivity type.

The aforementioned ion implantation processes P1-P5 may form doped regions like LDDs 108, source pocket doped regions 110, drain pocket doped regions 112, doped drains 114, sources S and drains D in the active area of present invention. The asymmetric source/drain doping patterns formed in the processes may effectively improve properties of gate-to-drain parasitic capacitance ($C_{GD}$), breakdown voltage at drain side ($BVD_{SS}$) and cut-off current ($I_{off}$) of the device, and at the same time maintain higher transconductance ($G_m$).

Figure 8:
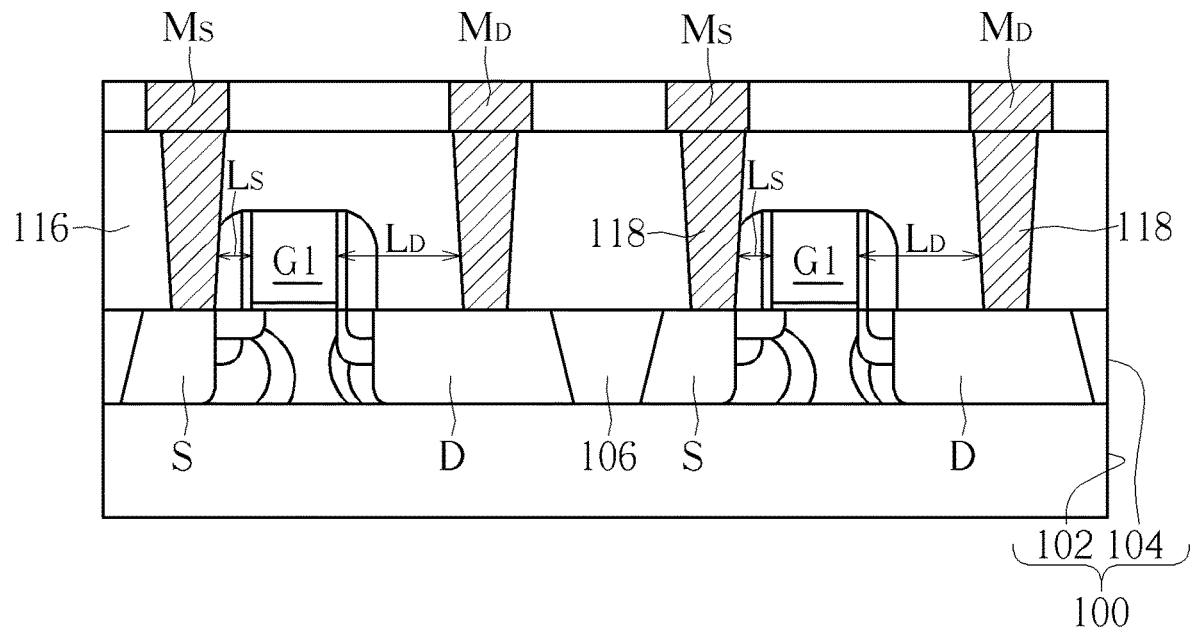

Please refer to FIG. 8. After the aforementioned various doped regions are formed, an interlayer dielectric layer 116 is formed covering the gate parts G1 and the active areas like sources/drains S/D and filling up the spaces between the gate parts G1. The material of interlayer dielectric layer 116 may be phosphosilicate glass (PSG), borophosphosilicate glass (BPSG) or low-k materials, which may be formed through sub-atmospheric chemical vapor deposition (SACVD) or high density plasma chemical vapor deposition (HDPCVD), and a chemical mechanical planarization (CMP) may be performed to provide a flat process surface. After the interlayer dielectric layer 116 is formed, contacts 118 are then formed in the interlayer dielectric layer 116 to connect the sources S and drains D thereunder. The material of contact 118 may include titanium (Ti), titanium nitride (TiN) and/or tungsten (W), which may be formed through a photolithography process for forming contact holes and a hole-filling process. Please note that in the embodiment of present invention, the distance $L_D$ between the gate parts G1 and the contacts 118 on the drain D in the second direction D2 is larger than the distance $L_S$ between the gate parts G1 and the contacts 118 on the source S in the second direction D2. This layout design may effectively increase the breakdown voltage at drain side ($BVD_{SS}$) and reduce parasitic capacitance ($C_{GD}$) between the drain D and gate part G1 to meet the requirement of RF devices in 5G communication network.

Refer still to FIG. 8. After contacts 118 are formed, source metals $M_S$ and drain metals $M_D$ are formed respectively above the corresponding sources S and drains D. Source metals $M_S$ and drain metals $M_D$ may be formed in the level of first metal layer (M1) in CMOS BEOL process, with low-resistance metal material like aluminum (Al), tungsten (W) and/or copper (Cu) through a sputtering process and a photolithography process. In the embodiment of present invention, as shown in FIG. 1, each source S or drain D is connected to a corresponding source metal $M_S$ or drain metal $M_D$ through a contact 118, and every source metal $M_S$ may extend outwardly to a common ground, and every drain metal $M_D$ may extend outwardly to a common RF output (RF Out), so as to constitute a multi-finger structure. This multi-finger layout design may effectively reduce gate resistance ($R_g$) and the noise generated therefrom in the process.

Figure 9:
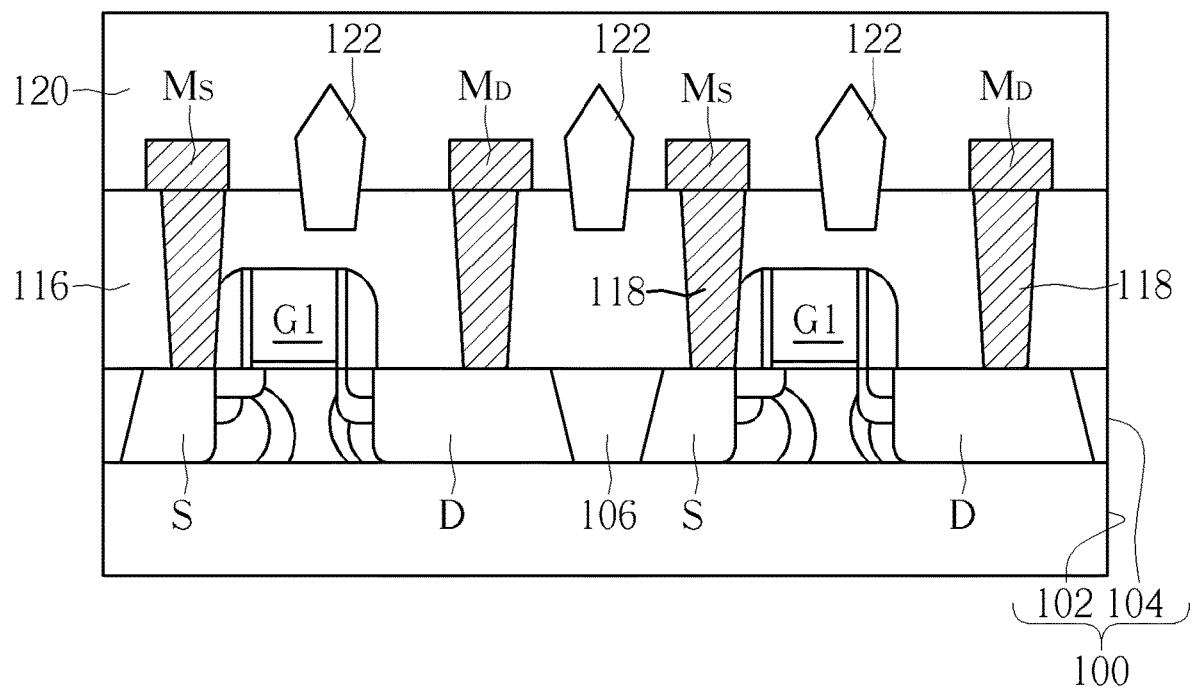

Please refer next to FIG. 9. After the source metals $M_S$ and drain metals $M_D$ are formed, an inter-metal dielectric (IMD1) layer 120 is formed covering the source metals $M_S$, drain metals $M_D$ and the interlayer dielectric layer 116. The material of inter-metal dielectric layer 120 may be undoped silicon glass (USG), fluorosilicate glass (FSG) or low-k materials which formed through a HDPCVD process. After the inter-metal dielectric layer 120 is formed, air gaps 122 are formed in the inter-metal dielectric layer 120 and the interlayer dielectric layer 116, which may be formed through a photolithography process and an imperfect gap-filling process. In the preferred embodiment of present invention, air gaps 122 are formed preferably in the dielectric layer between the gate part G1 and drain D. Air gaps 122 may also be formed in the dielectric layer between source S and drain D. These air gaps 122 may further reduce the parasitic capacitance between these components, especially the parasitic capacitance ($C_{GD}$) between gates and drains.

Figure 10:
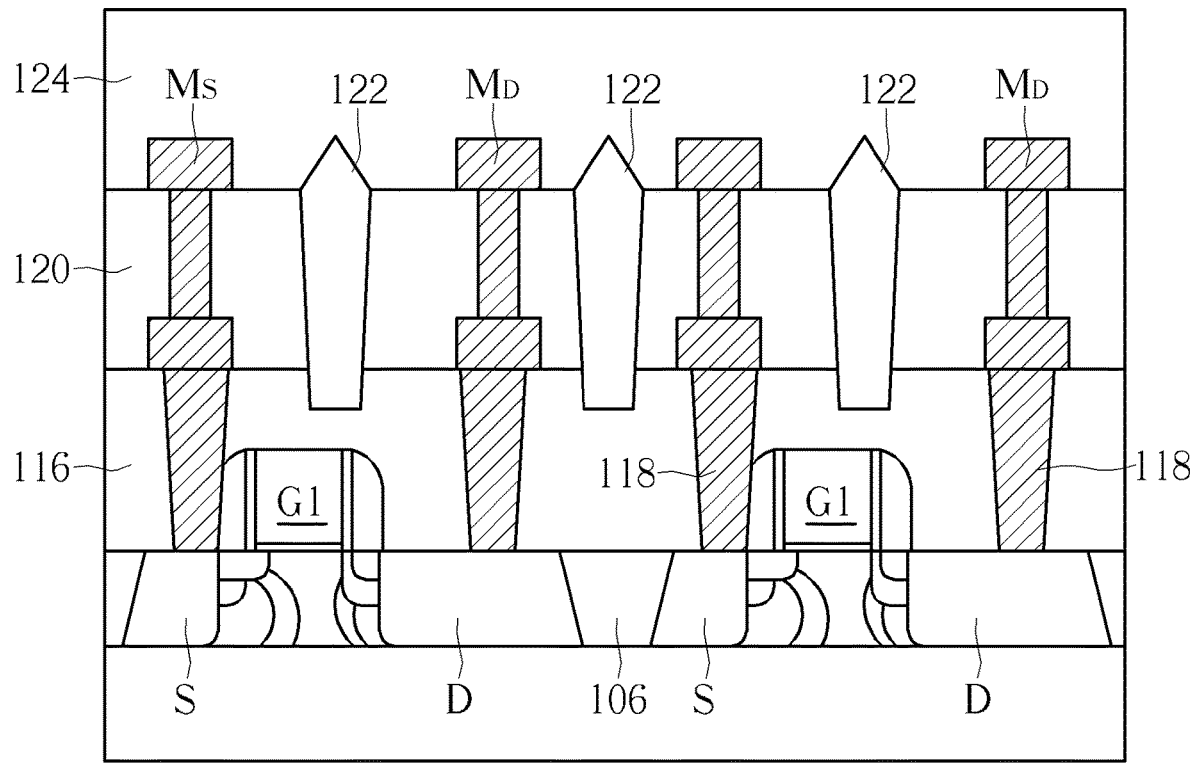
FIG. 10 is a cross-section of a multi-finger transistor structure in accordance with another embodiment of the present invention.

At last, please refer to FIG. 10. In other embodiment, source metals $M_S$ and drain metals $M_D$ may also include different metal levels in BEOL to reach impedance matching and gains required by the device. As shown in FIG. 10, source metals $M_S$ and drain metals $M_D$ may also include the metal layers (M1, M2) in the inter-metal dielectric (IMD1) layer 120 and the inter-metal dielectric (IMD2) layer 124, with vias electrically connecting between the two metal layers. In this embodiment, the range encompassed by air gaps 122 includes interlayer dielectric (ILD) layer 116, inter-metal dielectric (IMD1) layer 120 and inter-metal dielectric (IMD2) layer 124, in order to reduce adequately the parasitic capacitance between the source metals $M_S$ and drain metals $M_D$.

In conclusion to the aforementioned embodiments, the essential feature of present invention is to formed the source and drain of the multi-finger transistor structure in an asymmetric configuration, and contacts formed thereon and the distance between metal structures and gate are also designed in an asymmetric pattern, in order to improve the breakdown voltage at drain side and reduce parasitic capacitance. Furthermore, the air gaps formed in the dielectric layer may also effectively reduce the parasitic capacitance between gates, sources and drains. In addition, shallow trench isolations are formed between the active areas of multi-finger transistor structure, so that one photomask may be saved in the doping processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-finger transistor structure, comprising:
multiple active areas;
a gate structure, comprising multiple gate parts and multiple connecting parts, wherein each said gate part traverses one of said active areas, and each connecting part alternatively connect one end and the other end of two adjacent said gate parts, so as to form meander said gate structure;
multiple sources and drains, wherein one of said sources and one of said drains are set between two adjacent said gate parts, and one of said sources and one of said drains are set at two sides of each said gate part, and a distance between said drain and corresponding said gate part is larger than a distance between said source and corresponding said gate part; and
air gaps in a dielectric layer between each said drain and corresponding said gate part.

2. The multi-finger transistor structure of claim 1, further comprising multiple contacts on each said drains and each said source, wherein a distance between said contacts on said drain and corresponding said gate part is larger than a distance between said contacts on said source and corresponding said gate part, so that said contacts on said source and said contacts on corresponding said drain are asymmetric with respect to corresponding said gate part.

3. The multi-finger transistor structure of claim 2, wherein said contacts on each said source connect to one corresponding first metal layer, and said contacts on each said drain connect to another corresponding first metal layer.

4. The multi-finger transistor structure of claim 1, further comprising multiple contacts on each said connecting part.

5. The multi-finger transistor structure of claim 1, wherein said air gaps are further between adjacent said drain and said source.

6. The multi-finger transistor structure of claim 1, wherein multiple said air gaps are formed in said dielectric layer between each said drain and corresponding said gate part.

7. The multi-finger transistor structure of claim 1, wherein said dielectric layer comprises an interlayer dielectric layer, a first inter-metal layer and a second inter-metal layer.

8. The multi-finger transistor structure of claim 1, wherein said gate structure connects to a radio frequency input, and said source connects to a ground, and said drain connects to a radio frequency output.

9. The multi-finger transistor structure of claim 1, wherein a shallow trench isolation is formed between adjacent said active areas to isolate therebetween.

* * * * *